United States Patent [19]

Long

[11] Patent Number: 4,985,687
[45] Date of Patent: Jan. 15, 1991

[54] LOW POWER TEMPERATURE-CONTROLLED FREQUENCY-STABILIZED OSCILLATOR

[75] Inventor: Bruce R. Long, Carlisle, Pa.

[73] Assignee: PPA Industries, Inc., Dallas, Tex.

[21] Appl. No.: 485,565

[22] Filed: Feb. 27, 1990

[51] Int. Cl.[5] .......................... H03B 1/02; H03B 5/04; H03B 5/32
[52] U.S. Cl. ........................................ 331/69; 331/66; 331/70; 331/158; 310/315; 310/343; 310/344
[58] Field of Search ...................... 331/66, 69, 70, 158, 331/176; 310/315, 341, 342, 343, 344

[56] References Cited

U.S. PATENT DOCUMENTS

| | | | |
|---|---|---|---|
| 3,431,392 | 3/1969 | Garland et al. | 219/210 |
| 3,715,563 | 2/1973 | Bloch | 219/210 |
| 4,091,303 | 5/1978 | Tadataka et al. | 310/343 |
| 4,259,606 | 3/1981 | Vig | 310/343 |
| 4,701,661 | 10/1987 | Warner et al. | 310/360 |
| 4,748,367 | 5/1988 | Bloch et al. | 310/343 |

FOREIGN PATENT DOCUMENTS 0158718 12/1980 Japan .................................. 310/315

Primary Examiner—David Mis
Attorney, Agent, or Firm—Mason, Fenwick & Lawrence

[57] ABSTRACT

A quartz crystal resonator is situated in an enclosure whose interior is substantially a vacuum. A heating element is attached to the crystal surface. A sensor is attached to the crystal enclosure, and may be sandwiched between the crystal enclosure and the circuit board to which the crystal enclosure is attached. A control system converts the sensed temperature into a series of variable width pulses applied to the resonator heating element. Thus, the sensor, control unit and heating element comprise a temperature feedback control system which allows the crystal to operate at or very near its desired temperature. Further, the crystal enclosure may be substantially surrounded by an external material insulator. The external material insulator maximizes thermal resistance between the sensor and the environment in comparison to the thermal resistance between the crystal and the sensor. This choice of relative thermal resistances enables the temperature feedback control system to more closely emulate a closed-loop system possessing the advantages of accuracy and responsiveness. In an especially preferred embodiment, an integrated circuit from a switching power supply may be used in a novel manner to perform certain of the functions in the temperature feedback control loop.

8 Claims, 5 Drawing Sheets

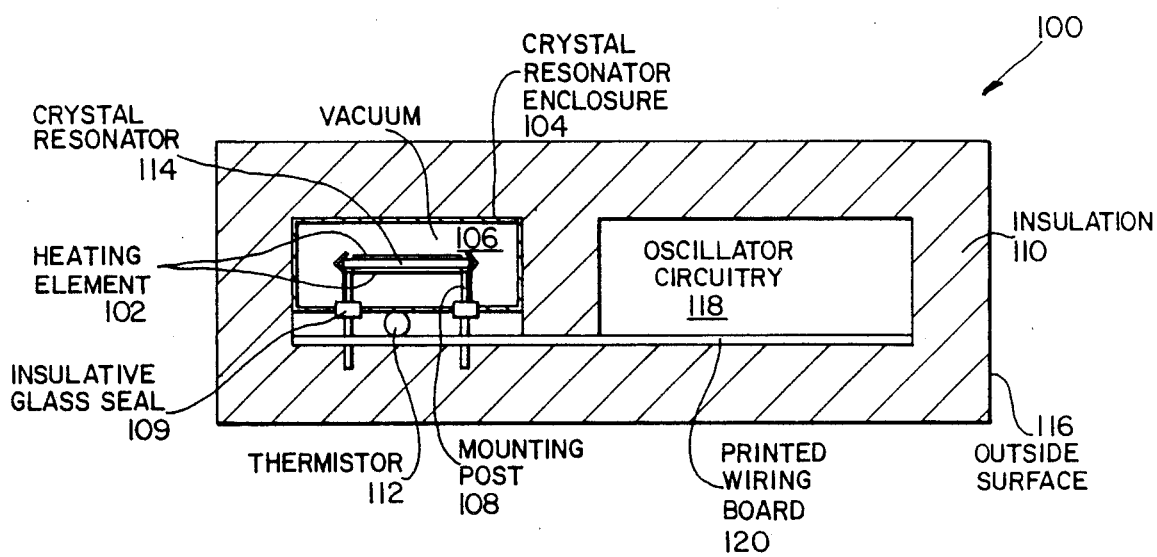
FIG. 1A
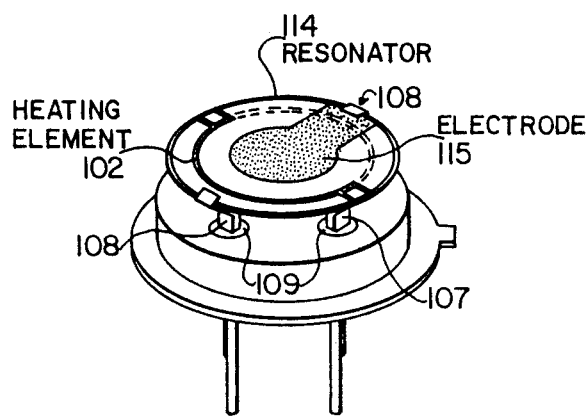
FIG. 1B
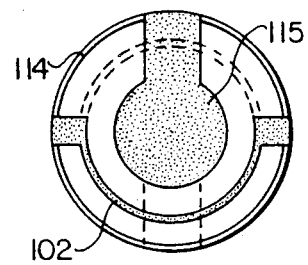
FIG. 1C
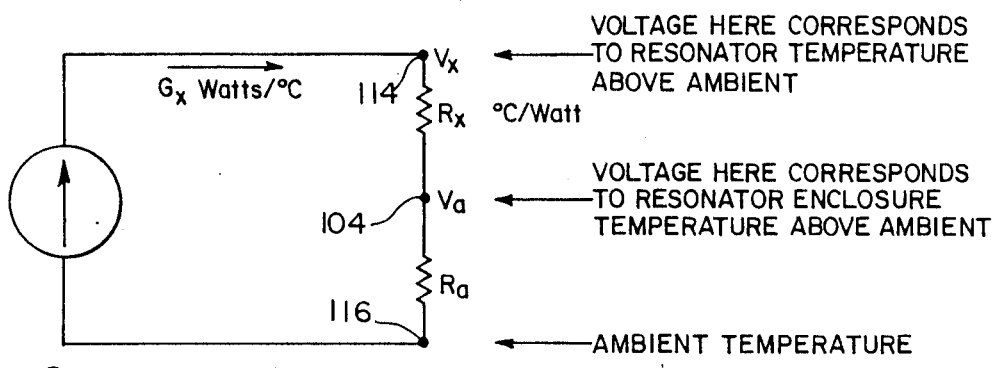
FIG. 2  THERMAL MODEL

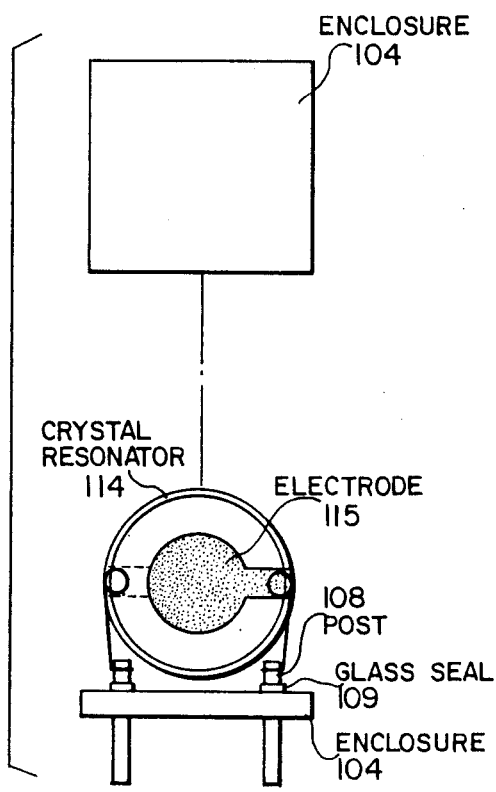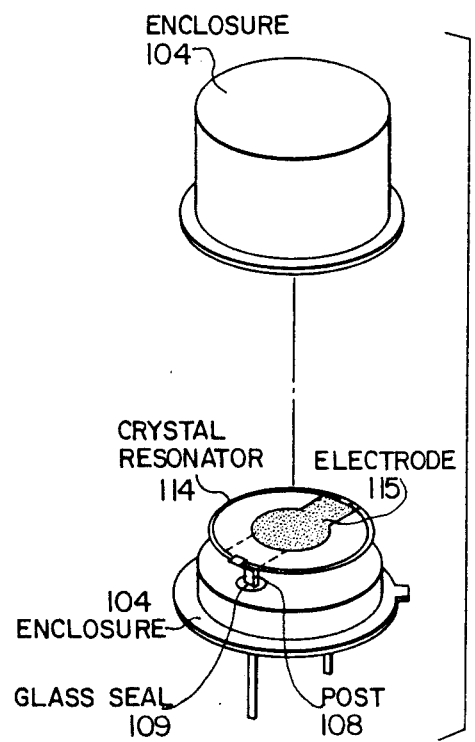
FIG. 7A
PRIOR ART
FIG. 7B
PRIOR ART

LOW POWER TEMPERATURE-CONTROLLED FREQUENCY-STABILIZED OSCILLATOR

BACKGROUND AND SUMMARY OF THE INVENTION

The present invention relates to oscillators. More specifically, it relates to improvements in crystal oscillators in which high-frequency stability must be achieved while consuming a minimum amount of power.

In many applications, the frequency of a quartz crystal oscillator must remain stable despite changing ambient temperatures. For example, in a positioning system using beacons on a target, and using satellites to track the target, the positioning function is implemented using an analysis of the Doppler shift caused by the relative motion of the satellite and target. A crystal oscillator in the target transmitter must have a stable frequency output, because any change in the frequency could cause the positioning system to interpret the frequency change as a Doppler shift, resulting in a positioning error. The stabilization of a crystal oscillator's frequency in the presence of changing temperatures, with the added demand that minimum power be consumed in a battery-powered unit, presents a challenge to the designer of the crystal oscillator.

One known solution is to temperature-compensate the oscillator. A voltage variable capacitor is added to the oscillator so that the frequency can be shifted a small amount by a correction voltage developed by a thermistor network. This correction voltage causes the oscillator frequency to remain substantially constant as the ambient temperature changes. Because perfect cancellation is not possible, there remains some residual frequency drift as a function of temperature. Additionally, the frequency correction network degrades the oscillator's phase noise characteristics and short term stability.

Another known solution is to maintain the entire oscillator including the quartz resonator at a precisely controlled elevated temperature, higher than the greatest expected ambient temperature. The oscillator temperature is regulated by a thermostat or a proportional controller. Excellent frequency stability is possible if a sufficiently accurate temperature feedback loop is employed. A temperature-regulated oscillator has far better frequency stability than the temperature-compensated oscillator described in the previous paragraph, and suffers no phase noise degradation However, for many battery-powered applications, the heater's electrical power requirement is impractically high.

It is therefore desirable to provide a low-power temperature-controlled quartz crystal oscillator intended for battery-powered applications.

Within the confines of standard practice, electrical heating power may be reduced in two ways. First, the thermal insulation surrounding the oscillator can be increased or improved. Second, the "set temperature" (the temperature to which the oscillator components are heated and maintained) can be lowered.

Unfortunately, only minor improvements are possible with either of these known approaches.

First insulation volume cannot be increased without increasing the overall size of the oscillator. This increase in size is generally not desirable or possible. Also, common insulation materials do not lend themselves to further development.

Second, lowering the set temperature introduces difficulties originating in the frequency-temperature characteristics of the quartz crystal resonator.

FIGS. 7A and 7B show two representative examples of known crystal resonators. In both cases the large circular body 114 is the quartz crystal resonator. Known crystal resonators generally consist of a slice of crystalline quartz, usually circular, with metallic electrodes deposited on each side. The illustrated resonator 114 has one circular electrode 115 deposited on each side of the resonator. Each electrode has a rectangular extension protruding to the edge of the resonator.

Two posts 108 provide mechanical support and electrical connection to the electrodes. These posts are electrically isolated from the resonator enclosure by glass seals 109.

The frequency-temperature characteristics of quartz crystal resonators are determined by the orientation of the quartz slice with respect to the natural axis of the crystal from which it is cut. The frequency-temperature coefficient can be made zero at a specific temperature by properly orienting the quartz slice. However, the temperature coefficient increases rapidly as the resonator temperature moves away from this optimum temperature. Temperature-controlled oscillators take advantage of the zero coefficient point to minimize the effects of ambient temperature variations. This means that the set point of the oscillator and the zero coefficient point of the resonator must be made to coincide. Accordingly, a group of quartz crystal resonators (specifically the AT-, IT- and SC-cut resonators) have been developed with a range of zero temperature coefficients occurring above the normally expected range of ambient temperatures, typically 75° C. to 85° C.

Although the zero-coefficient temperature can be varied by slight changes in crystal orientation, the extent of this variation is limited. This limited variability of zero-coefficient temperature limits the set temperature of conventional temperature controlled oscillators.

Temperature regulation of a conventional temperature-controlled oscillator is lost if the ambient temperature rises above the set temperature. The heater shuts down, and the oscillator follows the resonator's frequency-temperature curve. With traditional AT-, IT- or SC-cut resonators, frequency accuracy degrades rapidly. Loss of temperature regulation and limited control of the resonator zero-coefficient temperature place a practical lower limit on the set temperature.

As described in greater detail below, an alternative crystal cut, the FC-cut, is used by the present invention to overcome these limitations. First, the inventive crystal oscillator takes advantage of the realization that the zero temperature coefficient point can be set much lower than that of traditional AT-, IT- or SC-cut resonators. Second, with proper orientation, the zero-coefficient range can be made very broad. Specifically, an FC-cut crystal resonator of proper orientation possesses the frequency-temperature relationship shown in FIG. 6. At low temperatures, the frequency-temperature coefficient is unacceptably large and positive (shown in segment 602). Segment 602 is followed by a broad segment 604 in which the frequency-temperature curve is substantially flat. At high temperatures (illustrated as segment 606), the frequency-temperature coefficient again becomes unacceptably large.

With an FC-cut resonator such as that used in embodiments of the present invention, the oven set temperature can be placed on the lowest point in the substantially flat region 604. As the ambient temperature rises above the set temperature, the oscillator heater shuts down. Temperature regulation is lost, but unlike conventional temperature-controlled oscillators using AT-, IT- or SC-cut resonators, frequency stability remains acceptable. Therefore, the power savings of a low set point is realized without degrading frequency accuracy at high ambient temperatures.

It is also possible to reduce heat loss (and thereby reduce energy consumption) by reducing the volume of the heated enclosure. In known practice, both the crystal resonator and the oscillator circuitry are contained within a common temperature-controlled enclosure. The oscillator is elevated to nearly the same temperature as the resonator by means of the heated air contained within the enclosure. The large volume conventionally needed to enclose oscillator circuitry increases the quantity of electrical power required to maintain the elevated resonator temperature.

Because the crystal resonator has a very high Q, it is the crystal which substantially determines the frequency of oscillation. Remaining oscillator components have relatively little effect on the frequency of oscillation, even for temperature-induced parameter changes. Embodiments of the present invention take advantage of the realizations that heating power can be reduced by maintaining only the resonator at a constant elevated temperature, and that small frequency shifts caused by temperature-induced changes in other oscillator components can be safely disregarded.

The invention also takes advantage of the realization that additional power reduction can be achieved by applying heat directly to the resonator. In conventional practice, the resonator enclosure, not the resonator itself, is heated. Because the resonator enclosure is evacuated, heat is not conducted efficiently into the resonator. The only significant path for heat conduction into the resonator is through the resonator support posts 108. These posts, being long and thin, present a significant thermal resistance. ("Thermal resistance", in this sense, refers to a resistance to heat flow.)

The posts themselves are insulated from the resonator enclosure by glass seals 109. The glass seals 109 not only provide electrical insulation for the resonator support posts 108 where they penetrate the enclosure 104, but also serve to thermally insulate the support pins, thereby constituting a portion of the significant thermal resistance between the resonator 114 and its enclosure 104.

In the present invention, the previously unexploited thermal isolation of the resonator is used to advantage. According to embodiments of the present invention, the resonator is heated by an electrically resistive element deposited directly on its surface. In this implementation, the thermal resistance of the resonator support pins helps reduce the overall oscillator power consumption. Other oscillator components are warmed only to a small degree by the heat that incidentally leaks out of the enclosed resonator.

Efficient control of heating current is necessary to realize a low-power temperature-controlled oscillator.

In conventional practice, a variable-resistance pass element, typically a transistor, is used to vary the heating current. The principle of voltage division ensures that, undesirably, a sizable portion of heater power is dissipated in the control device instead of the heating element. Usually, this heat is recovered by mounting the control element directly on the temperature-controlled structure.

In contrast, according to the present invention, heat dissipation in the heater control device is effectively eliminated by employing pulse width modulation of the heater current. Heating power is conserved by applying it directly and solely to the resonator.

In summary, the present invention overcomes the disadvantages of known temperature controlled oscillators, as described above. As will be appreciated by reading the following disclosure, heating power expenditure is minimized by one or more of the following features (1) employing a lowered set temperature made feasible by use of an unconventional FC-cut crystal resonator;

(2) a reduction of the heated volume, thereby reducing heat loss;

(3) use of previously unexploited thermal isolation of the resonator by heating the resonator directly with a heating element (such as a resistive heating element), the heating element placed substantially directly on the surface of the resonator; and/or (4) use of pulse width modulation to control the heating current with maximum efficiency.

Furthermore, various embodiments of the present invention may include one or more of the following features, as recited in the claims which follow this specification.

A resonator, which may be a quartz crystal, is situated in a substantially evacuated enclosure so as to reduce thermal conductivity between the resonator and its enclosure. A heating element is deposited substantially directly on the resonator surface. The heating element is designed to controllably add thermal energy to maintain the resonator at a desired temperature.

A temperature sensor is attached to the crystal enclosure, and may be sandwiched between the crystal enclosure and the circuit board to which the crystal enclosure is attached. A control unit converts the sensed temperature into signal (such as a series of variable-width pulses) to be applied to the resonator heating element. Thus, the sensor, control unit and heating element comprise a temperature-feedback control system which allows the crystal resonator to reliably operate at or very near its desired temperature.

The crystal enclosure and accompanying oscillator circuitry may be surrounded by thermally insulative material, thereby further reducing the power consumption of the unit. Thermal insulation minimizes heat loss from the resonator, and also plays a substantial role in the function of the inventive temperature-feedback control system.

Furthermore, using an FC-cut resonator in certain preferred embodiments allows the resonator set temperature to be well below the highest expected ambient temperature without loss of frequency accuracy, thus achieving additional power savings. The minimum temperature coefficient region of an FC-cut resonator falls at a temperature much lower then that of crystal cuts commonly used in temperature controlled oscillators. The minimum temperature coefficient region is also much broader. The set temperature can therefore be lowered without incurring an unacceptable frequency deviation at high ambient temperatures.

In an especially preferred embodiment, an integrated circuit originally intended for use in switching power supplies may be used in a novel manner to perform certain of the functions in the temperature feedback loop control circuitry, thus simplifying implementation of these functions.

Other objects, features, and advantages of the present invention will become apparent upon a reading of the accompanying disclosure.

BRIEF DESCRIPTION OF THE DRAWINGS

The invention is better understood while reading the following Detailed Description Of The Preferred Embodiments in conjunction with the accompanying drawings, in which like reference numerals refer to like elements throughout, and in which:

FIG. 1A is a schematic representation of the preferred embodiment of a temperature-controlled frequency-stabilized oscillator according to the present invention.

FIG. 1B is a perspective view of the crystal resonator and heater elements of FIG. 1A, with a top portion of the crystal enclosure removed for purposes of demonstration.

FIG. 1C is a top plan view of the crystal and heater elements, shown as a top view of FIG. 1B.

FIG. 2 is a schematic diagram illustrating how the thermal resistivity concepts employed in the present invention may be thought of in terms of a voltage divider circuit driven by a series current source, for the purposes of facilitating an understanding of the present invention.

FIGS. 7A and 7B illustrate structures of conventional crystal oscillators and enclosures, without heating elements.

DETAILED DESCRIPTION OF THE PREFERRED EMBODIMENTS

Figure 3:
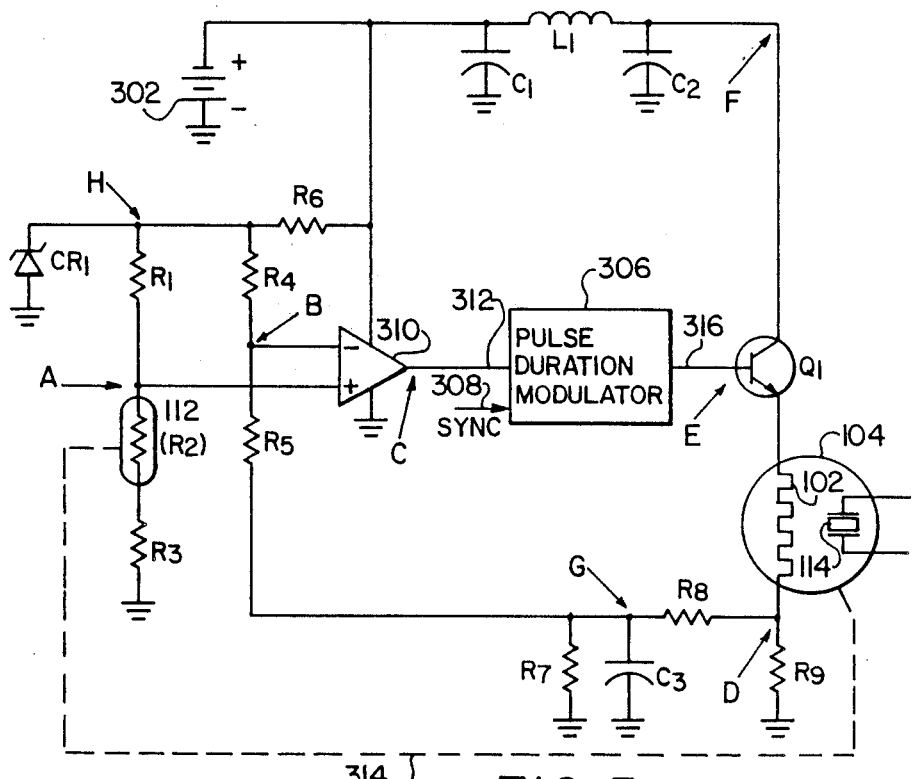
FIG. 3 is a circuit diagram illustrating the temperature control feedback according to a discrete component embodiment of the present invention.

In describing the preferred embodiments of the subject invention illustrated in the drawings, specific terminology will be employed for the sake of clarity. However, the invention is not intended to be limited to the specific terms so selected, and it is to be understood that each specific term includes all technical equivalents which operate in a similar manner to accomplish a similar purpose.

Resonator temperature is a major factor controlling the oscillator frequency, the temperature coefficient for the oscillator as a whole being small in comparison. For this reason, heating power can be conserved by heating only the resonator, the remaining oscillator circuitry warmed only by whatever heat escapes from the resonator.

In an embodiment shown in cross-section in FIG. 1A, a thin film resistance heating element 102 is deposited on the surface of the resonator 114. The heater resistance 102 may be applied with the same vapor deposition process used to deposit the electrodes in the normal manufacture of the crystal resonator. The physical thickness of the thin film heating element is limited in order to increase its electrical resistance. Typically, the resistance of the heating element should be approximately an order of magnitude larger than the leads carrying current to it, so that a maximum amount of the thermal energy released due to resistive heating is released on the resonator surface. Electrical current passing through heating element 102 thus heats the resonator 114 directly.

The quartz resonator is sealed inside an evacuated enclosure 104 to improve and preserve its performance. Resonators are advantageously enclosed in an evacuated enclosure to avoid the detrimental effects of atmospheric exposure. Air dampens the vibration of the resonator, increasing energy loss and lowering the resonator quality factor Q. Atmospheric oxygen and water vapor also oxidize the electrode material and contaminate the surface of the resonator itself causing a slow drift of the resonator resonant frequency known as aging.

According to the present invention, the evacuated enclosure also acts as an effective insulating layer. The vacuum's insulative effect can easily exceed that of several cubic inches of material insulation external to the resonator enclosure.

FIGS. 1B and 1C are perspective and top plan views, respectively, of a preferred embodiment of the crystal resonator 114, heating element 102, mounting leads 107, 108 and a portion of the crystal enclosure 104. As shown, a crystal resonator is preferably implemented with an FC-cut, for reasons discussed elsewhere in this specification.

The resonator design and manufacture deviates from conventional practice in the substantially direct attachment of the heating element 102, as described above. Two additional support pins 107, not found in known structures, provide electrical connection to the heater element. Support pins 108 provide electrical connection to the resonator electrodes, and may be implemented as in a conventional crystal resonator.

The illustrated resonator has a circular shape. Of course, the present invention may be practiced using resonators and/or heating elements other than those specifically described above.

Thermal Model

A thermal model, shown in FIG. 2, conceptually describes the function of the thermal control function employed in the inventive oscillator illustrated in FIGS. 1A, 1B and 1C. Simple thermal calculations are performed by analogy with Ohms Law in elementary circuit theory.

Heat flow (in watts) is analogized to electrical current. A heat source is modelled as a current source. Temperature difference corresponds to voltage. Thermal insulation is a resistance to heat flow, with units degrees Centigrade per Watt. In this analogy, a temperature difference corresponds to a voltage drop.

In the exemplary unit shown schematically in FIG. 1A, heat is applied directly to the resonator blank 114 by passing a pulsating electrical current I, generated by supply voltage V, through an electrical resistance R. I and V denote the average value of a duty cycle-modulated pulse train. Applied heat, represented in terms of voltage or current, equals $V^2/R$ or $I^2R$, respectively. Heat is applied to the resonator continuously so as to maintain a stable regulated temperature, to counteract the effects of heat loss to the outside surface 116. Because the resonator enclosure 104 is evacuated, heat flow is primarily by conduction through the resonator mounting pins 107 and 108 (FIG. 1B). The resonator enclosure 104, surrounded by thermal insulation 110, is warmed by heat passing through the resonator mounting posts. Likewise, the oscillator circuitry 118 is also warmed because it is in thermal contact with the resonator enclosure via printed wiring board 120.

The path taken by heat as it flows from the resonator 114 to the outside surface 116 through the elements mentioned above can be represented by two thermal resistances, $R_X$ and $R_A$. The first resistance $R_X$ is the resistance to heat flow between the resonator 114 and its evacuated metallic enclosure 104. The resonator mounting posts 108 and the glass seals 109 which electrically isolate the posts from the resonator enclosure make up this thermal resistance.

The second thermal resistance $R_A$ represents the resistance to heat flow between the resonator enclosure and the ambient environment. It comes primarily from the thermal insulation 110 packed inside the oscillator volume, but external to the resonator enclosure.

Suitable insulator material includes fiberglass products available from OWENS-CORNING FIBERGLASS CORP., Appliance and Transportation, Insulation Marketing Division, Fiberglass Tower, Toledo Ohio 43659, and cellular Polyisocyanurates foam insulation available from DOW CHEMICAL U.S.A., Urethanes Department, Midland, Mich. 48674.

The external dimensions of the temperature-controlled oscillator set an upper limit on the quantity of insulation used.

The temperature of the crystal enclosure 104 is sensed by (for example) a thermistor 112, and is used in a feedback control loop to regulate the heat applied to the resonator. The objective is to maintain the resonator temperature, even as the ambient temperature drops to some lower limit (of $-20°$ C. in the example of a satellite-based positioning system). Heat loss due to conduction must be compensated for by the heating element 102. A continuous match between heat lost and heat replaced is needed to exactly stabilize the resonator temperature.

Heat loss by the resonator is directly proportional to difference between the temperature of the resonator and its enclosure, divided by the thermal resistance $R_X$. This relationship is the basis for a temperature controller that adds heat linearly as the resonator enclosure temperature at 104 drops below a set threshold.

The resonator-to-enclosure thermal resistance $R_X$ is substantially determined by the mechanical design of the resonator mounting structures 107, 108, 109 and enclosure 104. For this reason, variations from unit to unit are small, and $R_X$ can be assumed to be constant. The enclosure-to-environment thermal resistance $R_A$ is determined substantially by the external insulation layer 110. The resonator enclosure temperature is the only unknown in the resonator heat loss calculation, and can be measured by a variety of temperature sensors.

As is known in the art, thermistors have a feature of a substantially linear resistance variation as a function of temperature, a feature which is employed to advantage in the preferred embodiment. The temperature sensor 112, as used in embodiments of the present invention, is an input for a control circuit (within FIGS. 3 or 5) that controls the supply of heat to the resonator. The control circuit is designed to have a transfer function $G_X$, with units Watts per °C. The transfer function $G_X$ may be thought of as a thermal conductance ideally equal to the reciprocal of the enclosure-to-ambient thermal resistance $R_X$.

Effects of External Insulation

Briefly, external insulation reduces the overall heat loss and provides negative feedback to the thermal control system, to advantageously reduce control errors. To clarify the role of external insulation, the operation of the temperature controller is described hereafter with and without external insulation.

Without external insulation the sensor temperature approaches the ambient temperature. The controller then applies heat to the resonator as the enclosure temperature drops below a specific set temperature. Heat is applied in proportion to the temperature drop. The accuracy of the temperature regulation is determined by how closely the temperature controller's gain $G_X$, measured in °C. per Watt, matches the thermal resistance $R_X$, which has reciprocal units Watts per °C. No thermal feedback exists to reduce the regulation error if the match is not perfect.

Also, without external insulation, the oscillator circuitry is exposed to the full range of ambient temperature excursions, and the heater power consumption is limited only by the resonator thermal resistance $R_X$.

In contrast, in the presence of external insulation, the temperature of the resonator enclosure and its attached temperature sensor falls between the resonator set temperature and ambient temperature. Employing the voltage divider analogy shown in FIG. 2, the enclosure temperature corresponds to the voltage at the junction of two thermal resistances $R_X$ and $R_A$. The first thermal resistance is between the resonator and its enclosure; the second thermal resistance is that presented by the external insulation between the resonator enclosure and the ambient temperature.

Given a large quantity of external insulation, $R_A$ is much greater then $R_X$, and, under steady state conditions, the sensor temperature is substantially equal to the resonator temperature. Consequently, thermal feedback is present and the temperature controller operates in a substantially closed loop fashion. Should the resonator be heated excessively, the sensor temperature would soon rise in response, causing the controller to expeditiously reduce the heating current applied to the resonator. This corrective action of reducing the heating current is a manifestation of the closed-loop thermal feedback feature according to the present invention.

External insulation also lowers power consumption by reducing heat loss and reducing the temperature excursions experienced by the oscillator circuitry. This lowering of power consumption and reduction of temperature excursions occurs because insulation improves the heating efficiency of the unit, even in the presence of some heat leaking out of the resonator enclosure. The amount of external thermal insulation, and the resultant benefit to oscillator operation, is generally limited by the external dimensions of the oscillator, and these in turn are defined by specification. Presence of a smaller amount of external insulation preserve some of the beneficial effects of thermal feedback, but to a correspondingly lesser extent.

Exemplary Circuit Description

FIG. 3 is a circuit diagram illustrating a preferred embodiment of the oscillator feedback control circuit according to the present invention. The structure of the illustrated circuit is as follows.

A battery 302, extending between VCC and ground, provides power for the circuit. In a positioning system in which a target transmitter is powered by a portable energy source, such as a battery, the conservation of this energy is of prime importance.

VCC is also connected to respective first ends of inductor L1, capacitor C1, resistor R6, as well as powering an amplifier 310. The second end of inductor L1 is connected to a first end of capacitor C2, as well as to the collector of a switching transistor Q1. The respective ends of capacitors C1 and C2 are connected to ground.

The second end of resistor R6 is connected to respective first ends of resistors R1 and R4, as well as to the cathode of a Zener diode CR1. The anode of Zener diode CR1 is connected to ground. The second end of resistor R1 is connected to the non-inverting input of amplifier 310, as well as to a first input of thermistor 112 (R2) which functions as a sensor. The second end of thermistor 112 is connected to a resistor R3, whose opposite end is connected to ground. The dotted line 314 extending from thermistor 112 to a crystal enclosure 104 indicates that the thermistor 112 is, in this preferred embodiment, in thermal contact with the crystal enclosure 104.

The second end of resistor R4 is connected to the inverting input of amplifier 310 as well as to a first end of a resistor R5. The second end of resistor R5 is connected to respective first ends of resistors R7, R8 and capacitor C3. Respective second ends of resistor R7 and capacitor C3 are connected to ground.

Figure 3A:
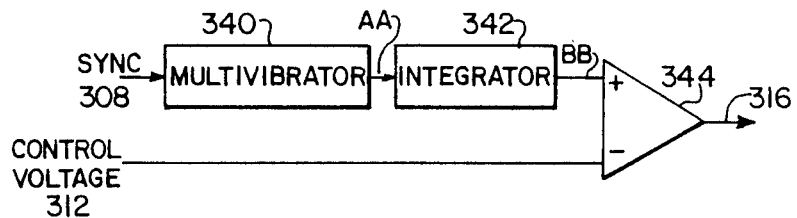
FIG. 3A is a diagram illustrating a preferred embodiment of the pulse duration modulator in FIG. 3.
Figure 3B:
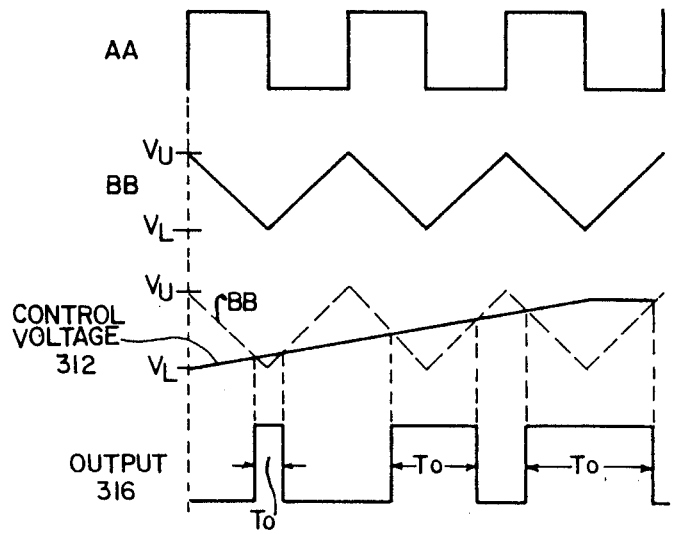
FIG. 3B illustrates waveforms at various locations in the pulse duration modulator shown in FIG. 3A.

The output of amplifier 310 controls the pulse duration modulator 306 along path 312. Pulse duration modulator 306 may be synchronized to an external signal via the SYNC input. This feature is useful in controlling interference that might result from transients occurring at the pulse switching rate. The pulse duration modulator 306 produces a train of pulses with durations proportional to the control voltage appearing on path 312. The pulse generation process is depicted in FIGS. 3A and 3B and is described in greater detail below.

The output of pulse duration modulator 306 controls the switching of switching transistor Q1 by direct connection to its base. The emitter of switching transistor Q1 connects to one end of the resonator heating element 102.

As described earlier, the heating element is preferably deposited directly onto the surface of the resonator along the outside edge of the resonator blank. This arrangement is depicted schematically in FIG. 3 by the circle 104 surrounding the heating element 102 and resonator 114.

The second end of heating element 102 is connected to the second end of resistor R8 and a first end of a resistor R9. The second end of resistor R9 is connected to ground.

Circuit Operation

Still referring to FIG. 3, and additionally FIGS. 3A and 3B, the resonator temperature is controlled by varying the duration of a series of voltage pulses applied to the heating element 102 on the surface of the resonator. Because the illustrated voltage pulses occur at a fixed rate, resonator heating is linearly proportional to the pulse duration. The pulse rate may be determined by an R-C oscillator contained within the pulse duration modulator, employing components Rt and Ct. Transistor Q1, driven by the pulse duration modulator, generates the heating pulses. Components C1, C2, and L1 constitute a filter network which smoothes the pulsating current drawn from the battery power supply 302.

Resistors R1 through R5 make up a balanced bridge circuit. A stable voltage to operate the resistance bridge comes from a Zener diode voltage regulator employing a Zener diode CR1, and a current-limiting resistor R6.

A thermistor 112, also designated R2, senses the temperature of the resonator enclosure. Because the thermistor has a negative temperature coefficient, a drop in temperature increases both the thermistor resistance and the voltage at Point A. When the bridge circuit is balanced, the voltages at Point A and at Point B (FIG. 3) are equal. The voltage at Point A is a function of resonator enclosure temperature; the voltage at Point B is a function of resonator heating current. A servo circuit comprising a differential amplifier, a pulse duration modulator and a current switch, adjusts the average resonator heating current to maintain the balance of the bridge. If the resonator enclosure temperature drops, the action of the servo circuit increases the heater current.

A stable zener regulated voltage energizes the bridge circuit which in turn is set up to balance at half the applied voltage. This means the total resistance of R2 and R3 must equal the resistance R1, the three resistances thus forming a two-to-one voltage divider. Resistances R4 and R5 on the other side of the bridge, having equal resistances, comprise a second two-to-one voltage divider. Resistances R8 and R9 have negligible effect upon the balance of the bridge because their resistance is much smaller than either R4 or R5. They do, however, make up a voltage feedback path.

Because the individual heater element (102) resistances may vary from unit to unit, and since the battery (302) voltage VCC will decrease with time as the battery is exhausted, the actual heating current is monitored by means of a current sensing resistor R9. During operation, a pulsating voltage is developed across R9, which is applied to an RC filter (R7, C3 and R8) to smooth out switching frequency ripple. The voltage G at the junction of R7, C3 and R8, representing the average heater current, is fed back to the reference leg of the thermistor bridge through R5. This causes the bridge voltage at Point B to increase as the heater current increases. R7 and R8 comprise a voltage divider which sets the magnitude of the negative feedback and therefore determines the gain of the control circuit.

Operation of the Pulse Modulator

Referring to FIGS. 3A and 3B, the pulse duration modulator controls the resonator heating current. As the temperature of the resonator case drops below the set temperature, the pulse duration increases in proportion.

As shown in FIGS. 3A and 3B, the pulse duration modulator 306 follows standard engineering practice and consists of a multi-vibrator 340, an integrator 342 and a comparator 344. The multi-vibrator generates a symmetrical square wave AA used to generate a triangle wave. Linearity of the pulse duration modulator depends upon the symmetry of the triangle wave and the square wave from which it is derived.

Integration of the square wave produces a triangle wave BB which is applied to an inverting terminal of the voltage comparator 344, with the amplified control voltage 312 from the thermistor bridge applied to the non-inverting input. The output 316 of the comparator is a pulse train; the duration of the pulses are advantageously a substantially linear function of the control voltage 312. When the pulse train 316 crosses the threshold defined by the control voltage 312, the output 316 of the comparator 344 changes state. As the control voltage 312 varies, so does the duty cycle of the comparator output signal 316.

Exemplary Component Values

Although the invention may be practiced using a variety of component values, based upon considerations known to those skilled in the art, the following component values are believed practicable in the embodiment of FIG. 3:

| Component | Value/Type |
|---|---|
| C1 | 3.3 Microfarads |
| C2 > = C1 | 3.3 Microfarads |
| C3 | 0.1 Microfarads |
| L1 | 39 Microhenries |
| Q1 | 2N2222 or equivalent |
| R1, R2, R3 | R1 = R2 + R3 at resonator set temperature |
| R4 | 180 K Ohms |
| R5 | 180 K Ohms |
| R6 | 1.6 K Ohms |
| R7 | 40 K Ohms |
| R8 | 10 K Ohm |
| R9 | 25 Ohms |
| CR1 | 5.1 V Zener diode; 1N751 or equivalent |
| Heating Element 102 | 400 Ohm |
| Crystal 114 | FC cut (see Detailed Description) |
| Battery 302 | 10.0 Volts |

Component values refer to FIG. 3. Derivations of values for components may be made in the following manner, presented as guidelines for illustrative purposes only.

Assume a crystal set temperature of 30° C. and a minimum ambient temperature of −20° C. With these assumptions, the maximum temperature difference between the resonator and its case is 50° C. The measured thermal resistance from the resonator to the case for a TO-8 style case is 248° C./W. The thermal conductance is then $4.03 \times 10^{-3}$ W/°C. and approximately 200 milliwatts is needed to maintain the resonator at the minimum ambient temperature.

$$(4.03 \times 10^{-3} W/°C.)(50°C.) = 200mW$$

Assume the resonator heater resistance totals 400 ohms and the battery voltage 10.0 volts. Ten volts continuously applied to a 400 ohm load dissipates 250 milliwatts. Under these conditions, an 80% duty cycle pulse train gives the heater power (200 mW) needed for a 50° C. temperature rise.

$$(0.80)(10V^2/400)ohms = 200mW$$

(Duty Cycle) (Voltage)$^2$(1/heater resistance) = 200mW and

Average Heater Current = 200mW/10 Volts = 20mA

The voltage drop across R9 indicates the current flowing through the heater resistance. A larger resistance value for R9 gives a larger indication but also wastes heating power. Limiting dissipation in R9 to 5% of the heater power gives a voltage drop across R9 equal to 0.5 volts. With 20 mA heater current:

$$R9 = (0.05)(10.0V)/20mA = 25 ohms$$

Voltage division across R6 and R9 provides a means to adjust the gain of the thermal controller. This way production variations of the heater resistance can be compensated. Assume a twenty percent adjustment range is necessary. R8 and R7 are then selected to reduce the voltage across R9 by twenty per cent. For the crystals with nominal heater resistance, no changes are necessary. Crystals with heater resistance above (below) nominal values are compensated by increasing (decreasing) the value of R7.

Resistor R8 also provides a filtering function in conjunction with C3. Choosing R8 equal to ten thousand ohms, and C3 equal to 0.1 microfarad, gives a low pass filter with a 6 dB cutoff point of 160 Hz and a six dB per octave roll-off. Resistor R7, 40 K, forms the voltage divider discussed above. Attenuation at the 50 kHz pulse frequency is sufficient to provide a ripple free feedback voltage.

As determined earlier, 20 mA of heater current is needed to maintain resonator temperature with the crystal enclosure at −30° C. At this temperature the following circuit voltages exist with R7 and R8 selected for a twenty percent adjustment range:

Voltage at Point D = (20 mA) (25 ohms) = 0.50 volts
Voltage at Point B = (Vref/2) + (0.50 V)(R7)/(R7+R8)
Voltage at Points B = (Vref/2) + 0.4 volts This servo action of the control circuit forces the voltage at Points A and B to be equal. Because thermistor resistance is a linear function of temperature, the voltage at Point A also varies linearly with temperature. This sets up a relationship between heater current and bridge voltage at Point B which enables determination of the resistance of R1, R2, and R3 and the thermistor (R2) temperature coefficient.

L1, C1 and C2 comprise a filter network that reduces the switching frequency ripple that might otherwise modulate the power supply voltage. C2 is a large value electrolytic capacitor. Assume a value of 3.3 microfarad. The reactance at the switching frequency (50 kHz) is then just under 1 ohm. The inductor should be as large electrically as possible without exceeding physical size and DC current limitations. The minimum inductance reactance at the switching frequency should be significantly larger than the shunt capacitor reactance. This translates into a minimum inductance of about 16 microhenry with the 3.3 microfarad capacitor given earlier. A 1025 series 39 microhenry inductor (manufactured by the Delevan Division of American Precision Industries, 270 Quaker Road, East Aurora, N.Y. 14052) having a DC resistance of 3.6 ohms and a maximum current rating of 125 mA is suitable. Capacitors C1 and C2 may be equal values, but if one must be larger, it should be C2. Capacitor-inductor combinations that are series resonant at the switching frequency should be avoided.

The pulse duration modulator can be advantageously locked to a sub-harmonic of the resonator frequency by injecting a synchronizing signal into the SYNC input. In this way, intermodulation between the oscillator and transients arising from operation of the pulse duration modulator is controlled. Intermodulation products may still be present, but because the oscillator and the switching frequencies are integer multiples, spurious beat notes less than the switching frequency are not possible. Thus, oscillator short-term stability is preserved in the presence of switching frequency transients without extensive filtering or voltage regulation.

The crystal oscillator can be implemented with discrete components or as an integrated circuit gate oscillator. A 4040 or 74HC4040 CMOS integrated circuit may be used (see FIG. 5). In this alternative embodiment, an inverter serves as the oscillator gain element, and is followed by a frequency divider chain. The divider chain can supply a subharmonic oscillator output or be used to synchronize the pulse duration modulator.

Placement of Thermal Sensor

Figure 4:
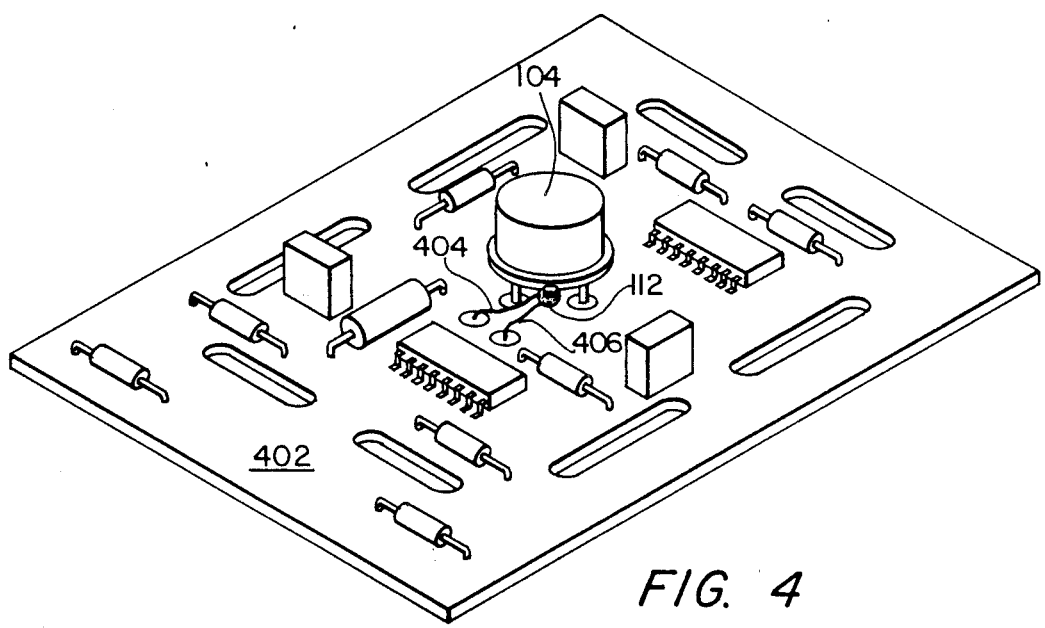
FIG. 4 is a perspective view of a circuit board illustrating the placement of an oscillator and a thermal sensing unit according to a preferred embodiment of the present invention.

FIG. 4 illustrates a circuit board on which thermal sensor 112 (such as a thermistor R2 in FIG. 3) is sandwiched between the oscillator body 104 and the circuit board 402. Leads 404 and 406 connect the thermal sensor 112 to other circuit components, such as bridge resistors R1 and R3 (FIG. 3).

In contrast to known temperature-controlled feedback systems, the present invention provides for placement of the thermal sensor between the oscillator package and the circuit board. The thermistor is commonly attached to the top or side of the resonator enclosure or it is attached with adhesive to a metallic heat spreading structure containing and surrounding the resonator case. The method described herein eliminates the manufacturing step of affixing the thermal sensor to the resonator case or to the heat spreading structure. Because the resonator must be affixed to the circuit board in any event, the initial placement of the thermal sensor on the target location for the oscillator causes a merger of the sensor attachment and resonator insertion steps of the manufacturing process. A thermally conductive compound can be used to insure good thermal contact between the sensor and the resonator enclosure.

Pulse Duration Modulator Construction

Figure 5:
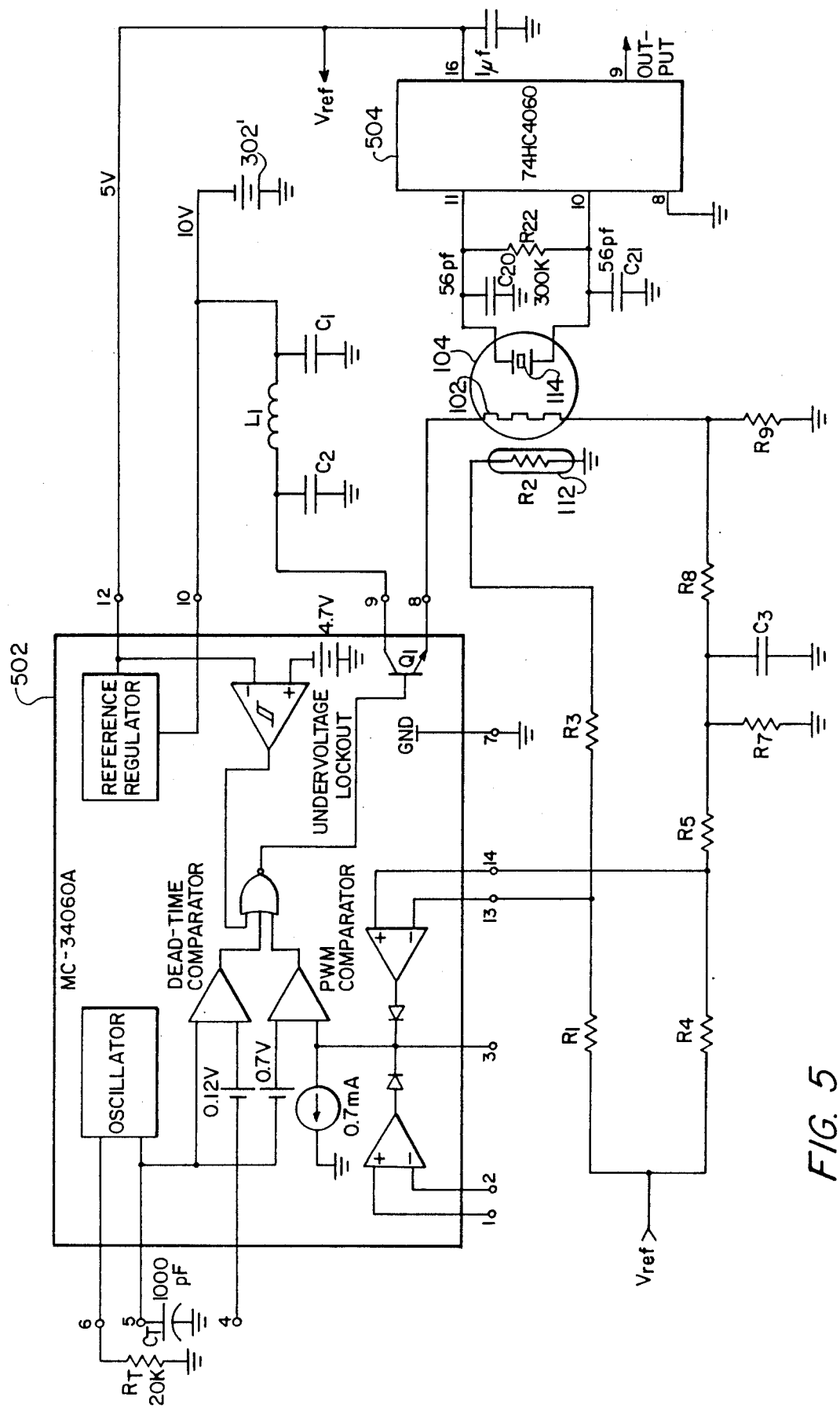
FIG. 5 is a circuit diagram showing how certain of the functions and elements in FIG. 3 may be implemented using an integrated circuit normally employed in switching power supplies.

While the pulse duration modulator may be constructed from discrete components, a more cost-effective and novel approach is to use the pulse modulator section of a standard integrated circuit meant for use in a switching power supply. The operational amplifier 310, the switching element Q1, the pulse duration modulator 306 and the voltage regulator CR1 (FIG. 3) are available on switching power supply integrated circuits, one of which is illustrated in FIG. 5. Appropriate integrated circuits include Motorola MC-33060A, MC-34060A, MC-35060A; National LM-1578, LM-2578, LM-3578; Texas Instruments MC-34060.

FIG. 5 is a circuit diagram illustrating the novel use of a switching mode pulse width modulation control circuit (designed for switching mode power supply control). In a preferred embodiment, an MC-34060 is employed. This integrated circuit is available from Texas Instruments, Inc., P.O. Box 655012, Dallas, Tex. 75265, and is described in the 1989 edition of the Texas Instruments LINEAR CIRCUITS DATA BOOK, Volume 3, pages 2–81 through 2–87.

Referring more specifically to FIG. 5, the switching mode circuit 502 is employed in implementing the circuit of FIG. 3 in the following manner. Pin 6, $R_T$, is connected to ground through a resistance having a value of 20 K ohms. Pin 5, $C_T$, is connected to ground through a capacitor having a value of 1000 picofarads giving a 50 kHz switching frequency. Pin 4, the dead-time control input, may be left un-connected. Pins 1 and 2, the non-inverting and inverting inputs to the first error amplifier and pin 3, the non-inverting input to the PWM comparator, are also left un-connected. Pin 10, VCC, is tied directly to the voltage source 302, providing a 10 volt input to a reference regulator internal to the switching mode chip 502. The internal regulator provides a regulated 5.0 volt source accessible to external circuitry via pin 12. The voltage pulses applied to the resonator heating element 102 are generated by transistor Q1. Its collector, accessible by pin 9, is connected to the 10 volt battery supply 302 through a ripple smoothing filter comprised of C1, C2, and L1 as described earlier. The emitter of Q1, accessible by pin 8, is connected directly to the resonator heating resistance 102. Pin 7 is connected to ground. Pins 13 and 14, the inverting and non-inverting inputs to a second error amplifier within the switching mode integrated circuit, are connected, respectively, to the nodes between resistors R1 and R3, and between R4 and R5. The inverting and non-inverting inputs are reversed with respect to FIG. 3 because of a polarity inversion in the pulse width modulator.

A voltage regulator internal to the switching mode integrated circuit 502 generates 5.0 volts available by pin 12 to power circuitry external to the integrated circuit 502. This voltage source, bypassed by a 0.1 microfarad capacitor, powers the balanced resistance bridge circuit shown in FIG. 3 and the crystal oscillator circuit implemented in FIG. 5 with a 74HC4060 integrated circuit 504. Regulated voltage with a magnitude of 5.0 volts is applied to pin 16 of integrated circuit 504. Pin 8 is ground. The resonator is connected to pins 10 and 11, as is a 300 K ohm resistor. Pin 11 is connected internally to the input of a logic inverter; pin 10 connects to the gate output. The 300 K ohm resistor serves to bias the digital gate into a quasi-linear mode enabling the gate to function as an amplifier which initiates and sustains oscillations in the resonator. Capacitors C20 and C21, connected respectively to integrated circuit 504 pins 11 and 10 provide a load for the crystal resonator and establish the phase shift necessary for oscillation. A logic level pulse train at the resonator frequency is available from pin 9 providing the output of the oscillator as a whole. Alternatively, outputs at several integral sub-harmonics of the resonator frequency are available from pins 1 through 7 and 13 through 15. These can serve as oscillator outputs instead of, or in addition to, the fundamental output on pin 9 or can be used to synchronize the switching frequency of the pulse duration modulator as discussed earlier.

All other portions of the circuit illustrated in FIG. 5 may function in the manner described above, with respect to FIG. 3. However, the switching mode chip 502 assumes the function of the FIG. 3 elements, the diode CR1, amplifier 310, pulse duration modulator 306, and switching transistor Q1. Also, thermistor 112 (R2) and resistor R3 may be switched in the order in which they are arranged in series. Also the oscillator which initiates and sustains oscillations in conjunction with the resonator 114 need not necessarily be implemented with a 74HC4060 integrated circuit. Other integrated circuits or discrete circuit embodiments may be employed.

The 74HC4060 14-stage binary ripple counter with oscillator employed in the preferred embodiment, is available from Motorola, and is described in the Motorola High Speed CMOS Logic Databook (1983) on page 5-395.

Preferred Resonator Cut

In known temperature-controlled oscillators, the set temperature (and consequently the crystal resonator zero frequency temperature coefficient point) are placed significantly above the highest expected ambient temperature. Substantial energy is used to heat the resonator an associated oscillator circuitry to the elevated set temperature. After the oscillator is heated to the set temperature, resonator temperature must be controlled very closely even in the presence of large changes in ambient temperature, to achieve the desired frequency stability.

As described previously in the Background of the Invention, lowering the set temperature of a conventional temperature controlled oscillator to save heating energy is not feasible. Specifically, frequency accuracy is degraded if ambient temperature exceeds the oscillator set temperature. In this situation, control of the resonator temperature is lost and the oscillator frequency follows the resonator frequency-temperature curve. Because the range of zero frequency-temperature slope in conventionally-employed resonators is so narrow, a resonator temperature increase as small as one or two degrees Centigrade causes unacceptable frequency drift. For practical purposes, the "range" may even be considered a point on the curve.

Accordingly, the present invention uses a less common resonator cut that can be described as having a region (instead of a point) of acceptably low frequency-temperature slope.

Figure 6:
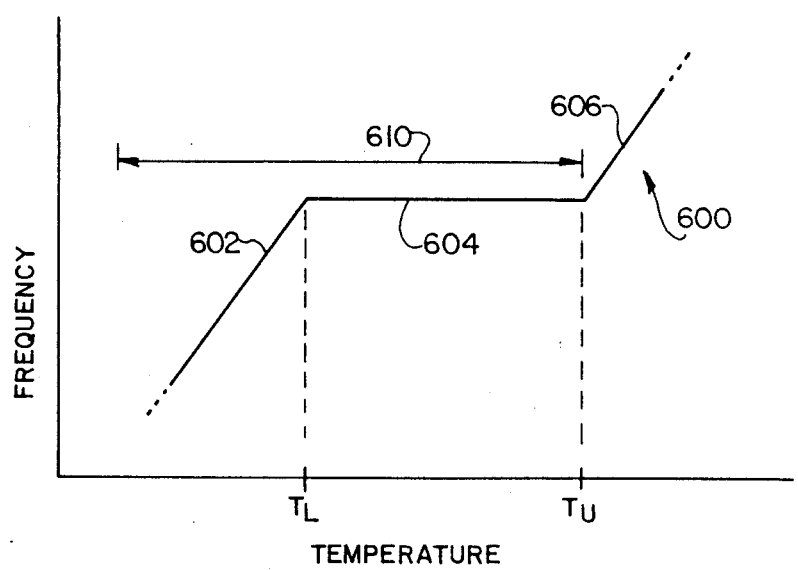
FIG. 6 is a frequency-temperature curve illustrating regions of zero and non-zero temperature coefficient, useful in explaining the operating point of embodiments of the present invention.

FIG. 6 is a frequency-temperature characteristic curve 600 having three segments 602, 604, and 606. The curve is illustrative of a properly oriented FC-cut crystal resonator. Lower segment 602 illustrates a temperature range in which the temperature coefficient is unacceptably large. Intermediate segment 604 illustrates a temperature segment between $T_L$ and $T_U$ in which the temperature coefficient is acceptably small. Finally, upper segment 606 illustrates a temperature range in which the temperature coefficient is again unacceptably large.

The FC-cut resonator has a broad flat segment in its frequency-temperature curve covering approximately $T_L = 30°$ C. to $T_U = 70°$ C. The set temperature of a temperature-controlled oscillator using such a resonator can be near or at the lower limit of the flat segment. In this case, the set temperature of oscillators according to the present invention can be less than the highest expected ambient temperature. The ambient temperature range is illustrated as segment 610.

Therefore, the temperature of the resonator is allowed to drift within the portion of the flat coefficient greater than $T_L$ but still less than the highest expected ambient temperature. Heat is needed only if the ambient temperature drops below $T_L$. Moreover, the resonator temperature need only be raised back to $T_L$, so that the resonator does not operate along the high coefficient segment 602.

Operating a crystal oscillator in a flat portion of the temperature characteristic curve within a segment of the expected ambient temperature range, and applying heat only below the lower temperature $T_L$, has several advantages. Power is saved because an unnecessarily high temperature need not be constantly maintained. Furthermore, because heat is applied only if the temperature drops down into the lower segment 602, additional power saving result when ambient temperature is above $T_L$ (in fact, the heating power requirement is zero). In this manner, substantial power savings is attained, without substantially compromising the oscillator frequency stability.

Thus, the invention may be further conceived as enabling a temperature-controlled oscillator for operation at actual ambient temperatures within an expected ambient temperature range, the oscillator comprising: a resonator for producing a signal having a desired frequency, the resonator having a temperature coefficient curve with a range in which the slope of the curve is substantially zero, the range substantially defined by a lower limit temperature $T_L$ and an upper limit temperature $T_U$, the lower limit temperature $T_L$ disposed substantially within the expected ambient temperature range and the upper limit temperature $T_U$ disposed approximately at or above an upper limit of the expected ambient temperature range, the resonator having an operational temperature which may vary as a function of time; a heating element for providing thermal energy to the resonator; a thermal sensor, for sensing a temperature substantially related to the operational temperature of the resonator; and a control circuit for receiving the sensed temperature from the thermal sensor and for governing an amount of thermal energy which the heating element provides to the resonator, the control circuit causing the heating element to provide heat to the resonator only when the operational temperature of the resonator is a given amount below the lower limit temperature $T_L$; in which the control circuit does not cause the heating element to supply thermal energy to the resonator when the ambient temperature is above approximately the lower limit temperature $T_L$, so that energy is not expended in heating the resonator when the actual ambient temperature is above a certain temperature in the expected ambient temperature range; and in which the desired frequency is maintained substantially constant throughout the entire expected ambient temperature range.

Conclusion

It is apparent that many modifications and variations of the above-described embodiments of the present invention are possible in light of the above teachings. It is therefore to be understood that, within the scope of the appended claims and their equivalents, the invention may be practiced otherwise than as specifically described.

What is claimed is:

1. A temperature-controlled crystal resonator oscillator, comprising:

a resonator having a resonance frequency which varies as a function of the temperature of the resonator;

a heating element in substantially direct thermal contact with the resonator, for applying heat to the resonator;

a resonator enclosure containing in its interior the resonator and the heating element, the interior of the resonator enclosure being substantially a vacuum;

a heat-sensing device in substantially direct thermal contact with the resonator enclosure, for sensing the temperature on the resonator enclosure;

an insulative layer at least partially surrounding the resonator enclosure, so as to increase the thermal resistance between the resonator enclosure and an ambient environment; and a feedback control circuit receiving the sensed temperature of the resonator enclosure and generating a heater control signal for determining the manner in which heat is applied to the resonator by the heating element;

wherein the control circuit provides dynamic control of the resonance frequency of the resonator through feedback of the sensed temperature on the resonator enclosure in a substantially closed-loop manner.

2. The oscillator of claim 1, wherein the feedback control circuit comprises a switching mode integrated circuit.

3. A temperature-controlled crystal resonator oscillator, comprising:

(a) a power source;

(b) a resonator having a resonance frequency which varies as a function of the temperature of the resonator;

(c) a heating element in substantially direct thermal contact with the resonator, for applying heat to the resonator;

(d) a resonator enclosure containing in its interior the resonator and the heating element, the interior of the resonator enclosure being substantially a vacuum;

(e) a heat-sensing device in substantially direct thermal contact with the resonator enclosure, for sensing the temperature on the resonator enclosure;

(f) an insulative layer at least partially surrounding the resonator enclosure, so as to increase the thermal resistance between the resonator enclosure and an ambient environment;

(g) a feedback control circuit receiving the sensed temperature of the resonator enclosure and generating a control signal for determining the manner in which heat is applied to the resonator by the heating element, wherein the feedback control circuit comprises:

(1) a current sensing resistor for sensing the average current through the heating element, for generating a reference signal;

(2) a balanced bridge circuit responsive to variations in the temperature of the resonator enclosure as sensed by the heat-sensing device and to the reference;

(3) an amplifier, responsive to a signal from the balanced bridge circuit, for generating the control signal in response to the sensed temperature of the resonator enclosure;

(4) a pulse duration modulator, responsive to the control signal from the amplifier and to a synchronization signal, for generating a pulse train having a variable duty cycle; and (5) a switching element, responsive to the pulse train from the pulse duration modulator for drawing current from the power source and applying it to the heating element in thermal contact with the resonator; and (h) a filter network for smoothing out current pulses drawn from the power source;

wherein the control circuit provides dynamic control of the resonance frequency of the resonator through feedback of the sensed temperature on the resonator enclosure in a substantially closed-loop manner.

4. The oscillator of claim 3, wherein the feedback control circuit comprises a switching mode integrated circuit.

5. A temperature-controlled resonator oscillator, comprising:

a circuit board;

a heat-sensing device disposed at a predetermined site on the circuit board; and a resonator oscillator package comprising a resonator inside an evacuated enclosure, the resonator oscillator package attached to the circuit board atop the site at which the heat-sensing device is situated, the oscillator package attached so that the resonator enclosure is in substantially direct thermal contact with the heat-sensing device without the heat-sensing device being adhesively affixed to sides or top of the oscillator assembly;

wherein the temperature of the resonator enclosure sensed by the heat-sensing device is fed back through a control circuit so as to control the temperature of the resonator.

6. A temperature-controlled oscillator for operation at actual ambient temperatures within an expected ambient temperature range, the oscillator comprising:

a resonator for producing a signal having a desired frequency, the resonator having a temperature coefficient curve with a range in which the slope of the curve is substantially zero, the range substantially defined by a lower limit temperature $T_L$ and an upper limit temperature $T_U$, the lower limit temperature $T_L$ disposed substantially within the expected ambient temperature range and the upper limit temperature $T_U$ disposed approximately at or above an upper limit of the expected ambient temperature range, the resonator having an operational temperature which may vary as function of time;

a heating element for providing thermal energy to the resonator;

a thermal sensor, for sensing a temperature substantially related to the operational temperature of the resonator; and a control circuit for receiving the sensed temperature from the thermal sensor and for governing an amount of thermal energy which the heating element provides to the resonator, the control circuit causing the heating element to provide heat to the resonator only when the operational temperature of the resonator is a given amount below the lower limit temperature $T_L$;

wherein the control circuit does not cause the heating element to supply thermal energy to the resonator when the ambient temperature is above approximately the lower limit temperature $T_L$, so that energy is not expended in heating the resonator when the actual ambient temperature is above a certain temperature in the expected ambient temperature range; and wherein the desired frequency is maintained substantially constant throughout the entire expected ambient temperature range.

7. The oscillator of claim 6, wherein the resonator comprises an FC-cut resonator.

8. An oscillator, comprising:

an FC-cut crystal resonator having a resonant frequency which may vary as a function of the temperature of the resonator; and a heating element, disposed in direct thermal contact with the resonator, for supplying thermal energy to the resonator so as to control its resonant frequency.

* * * * *